(12) United States Patent
Buxkemper et al.

(10) Patent No.: US 8,395,394 B2
(45) Date of Patent: Mar. 12, 2013

(54) SYSTEM AND METHOD FOR POWER SYSTEM COMPONENT TESTING

(75) Inventors: Bruce Andrew Buxkemper, College Station, TX (US); Joseph Laval Tremblay, College Station, TX (US); Douglas James Sawyer, College Station, TX (US)

(73) Assignee: AVO Multi-Amp Corporation, Dallas, TX (US)

( * ) Notice: Subject to any disclaimer, the term of this patent is extended or adjusted under 35 U.S.C. 154(b) by 1256 days.

(21) Appl. No.: 12/184,962

(22) Filed: Aug. 1, 2008

(65) Prior Publication Data

US 2010/0026312 A1 Feb. 4, 2010

(51) Int. Cl.
*G01R 31/06* (2006.01)
(52) U.S. Cl. ........................................ 324/547
(58) Field of Classification Search .................. 324/547
See application file for complete search history.

(56) References Cited

U.S. PATENT DOCUMENTS

| | | | |
|---|---|---|---|
| 6,549,017 B2* | 4/2003 | Coffeen | 324/547 |
| 6,774,639 B1* | 8/2004 | Unsworth | 324/547 |
| 2004/0124860 A1* | 7/2004 | Hamdan | 324/726 |
| 2004/0130329 A1* | 7/2004 | Suss et al. | 324/547 |

* cited by examiner

*Primary Examiner* — Amy He
(74) *Attorney, Agent, or Firm* — Conley Rose, P.C.; J. Robert Brown, Jr.

(57) ABSTRACT

A method of testing a power system component is disclosed. The method includes coupling a test set to the power system component and displaying a test form on a display integral with the test set. The method also comprises inputting at least a first test control parameter into the test form using an interface integral with the test set. The method also comprises stimulating the power system component using the test set to produce a first response of the power system component, wherein the stimulating is performed based at least in part on the first test control parameter. The method also comprises displaying a first test result in the test form on the display, wherein the first test result is based on the first response.

15 Claims, 5 Drawing Sheets

SYSTEM AND METHOD FOR POWER SYSTEM COMPONENT TESTING

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

The electrical power system in the United States generates three-phase alternating current (AC) electrical power. Each power phase is 120 degrees out of phase, plus or minus, with the other two power phases. The voltage of any phase oscillates sinusoidally between positive voltage and negative voltage. It happens that three-phase electrical power generation, transmission, and distribution provides an acceptable compromise between the efficiency and the expense and complexity of power system equipment.

It is more efficient to transmit electrical power at high voltage levels than at low voltage levels. Electrical power may be generated as three-phase AC power at moderate voltage levels in the 12 thousand volt (kV) to 25 kV range. The voltage level may stepped up to the 110 kV to 1000 kV range using a transformer for transmission over long transmission lines, hence minimizing transmission line power loss. The transmission line voltage may be stepped down, using a transformer at a substation, to the 12 kV to 35 kV range for local distribution. The local distribution voltage level may be further stepped down through one or more transformer stages to provide 120 volt AC power to the home and office. Special accommodations may be made for manufacturing plant electrical power consumers. In some contexts, the electrical power system may be abstractly categorized into electrical power generation, electrical power transmission over extended distances, and electrical power distribution to electrical power consumers.

Power system transformers may comprise three pairs of wire windings, one pair of windings for each phase. Each pair of wire windings is constructed so that an alternating electric current in a primary winding creates a fluctuating electromagnetic field that couples into the secondary winding, thereby inducing a corresponding alternating electric current in the secondary winding. Typically the primary and secondary windings are wound on a common core that improves the efficiency of the transformer by concentrating the electromagnetic field within the common core, thereby improving the coupling between the primary and secondary windings. The voltage in the secondary winding is proportional to the voltage in the primary winding, and the current in the secondary winding is inversely proportional to the current in the primary winding, where the proportionality in both cases is based on the ratio of the number of turns of wire in the secondary winding to the number of turns of wire in the primary winding. This ratio is referred to as the turns ratio. The performance of power system transformers may change as insulation of the windings deteriorates, as resistance of the winding wires changes over time or with temperature, as physical properties of the common core changes over time, and other. The ratio of number of turns in the secondary winding and the number of turns in the primary winding may change if a turn shorts at a point of insulation breakdown. A wide variety of power system transformer configurations is known, and some transformers may vary somewhat from the general description above. Some transformers may be autotransformers. Some transformers may have taps.

Testing of power system transformers may be conducted by connecting a test set to the windings of the power system transformers and exciting the primary winding and the secondary winding with electrical signals, both direct current and alternating current. Testing may be conducted on one transformer phase at a time, or may be conducted on multiple transformer phases concurrently. From some points of view, testing generators has some similarities to testing transformers. An exciter winding in a generator may be considered to be similar, in some respects, to a transformer winding. The windings of a generator may be considered to be similar, in some respects to a transformer winding. Transporting the power system transformer or generator to a controlled test laboratory environment may not be economically feasible, and therefore testing typically occurs on site, often outdoors in variable weather conditions. As can readily be appreciated by one skilled in the power distribution art, the testing environment associated with high voltage power system transformers may be subject to intense electric field fluxes as well as high levels of air borne dust and grit.

SUMMARY

A method of testing a power system component is disclosed. The method comprises coupling a test set to the power system component and displaying a test form on a display integral with the test set. The method also comprises inputting at least a first test control parameter into the test form using an interface integral with the test set. The method also comprises stimulating the power system component using the test set to produce a first response of the power system component, wherein the stimulating is performed based at least in part on the first test control parameter. The method also comprises displaying a first test result in the test form on the display, wherein the first test result is based on the first response.

A test set is also disclosed. The test set comprises a harness, at least a first stimulator circuit, at least a first detector circuit, an interface, a test controller, and a case. The harness is operable to connect the test set to at least a first power system transformer winding. The at least first stimulator circuit and detector circuit are coupled to the harness. The interface is configured to display a test form and to receive test control inputs, wherein the test form comprises test control parameter fields and test result parameter fields. The test controller is coupled to the interface, to the at least first stimulator circuit, and to the at least first detector circuit. The test controller is configured to promote display of at least some of the test control inputs to the interface to display within associated test control parameter fields of the test form, to control the at least first stimulator circuit to test the first power system transformer winding based at least in part on the test control parameter fields of the test form, to control the at least first detector circuit to determine a result of testing the first power system transformer winding, and to promote display of the result of testing the first power system transformer winding in test result parameter fields of the test form substantially in real-time. The case encloses the at least first stimulator circuit, the at least first detector circuit, the interface, and the test controller.

A test set for testing a power system transformer is disclosed. The test set comprises a coupling to connect the test set to the power system transformer, a display showing a test form having control parameters and result parameters, and a controller. The coupling is configured to transmit a test signal to the power system transformer and to receive a test response associated with the test signal from the power system transformer. The controller is configured to control transmission of the test signal during a first test session based at least in part on the values of the control parameters during the first test session, to analyze the test response associated with the test signal transmitted during the first test session to determine a first test result, and to display at least part of the first test result in the result parameters, and to store the first test result. The controller is also configured to control transmission of the test signal during a second test session based at least in part on the values of the control parameters during the second test session, to analyze the test response associated with the test signal transmitted during the second test session to determine a second test result, to display at least part of the second test result in the result parameters, to project a performance trend of the power system transformer based on comparing the second test result with the stored first test result, and to display the performance trend in the display.

A portable test device is also disclosed. The portable test device comprises a display showing a form and at least a first stimulator component. The form comprises at least a first parameter to control a test of an equipment and at least a second parameter to indicate at least a portion of the results of the test of the equipment. The first stimulator component is configured to produce a signal to test the equipment according to the at least first parameter.

A system is also disclosed. The system comprises a tool to promote creating one or more customized test forms such that when the test forms are used by a test set during testing of a power system at least some of the test results are displayed in the test form on a display of the test device.

A power system test set is also disclosed. The power system test set comprises a display, an interface, and an output device. The interface is configured, responsive to receiving a test result, to present the test result in a form to the display. The output device is configured to promote outputting the form in substantially a similar format as the form presented to the display.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents.

A power system component test set is disclosed. The test set stimulates a component with a known signal, detects the response of the component to the known signal, analyzes the response based on the stimulation signal, and determines values of component parameters. The test set may further include a database of component parameters determined during earlier testing and is configured to perform trend analysis of component parameters over time, for example predicting a future date that the component will first fail to meet specifications or predicting a future date of failure. The test set is self-contained, wherein the stimulation circuitry, detection circuitry, analysis components, and database of earlier test results are all contained within a single case. The test set is ruggedized and shielded appropriately to provide good service in the harsh electrical environment of a power generation and/or power distribution station and exposed to the weather. The test set operation may be controlled using a form interface. An operator defines values of some form parameters, and the test set uses the defined form parameter values to generate appropriate stimulation signals and to analyze the response of the component under test. Results of the test are displayed substantially in real-time in the form interface in appropriate fields. The form interface may be a display screen in association with a keyboard or keypad. The test set may be optionally coupled to a printer at the test location, and the test results may be printed out on-location and left with the electrical power operating company. In some contexts, the electrical power operating company may be referred to as the electrical power utility company. The test results are printed out in substantially the same format and containing the same values as presented in the display screen. This may be referred to as a what-you-see-is-what-you-get results printout. The form may be redefined or customized by an operator to test the component differently and to present the test results differently, for example in a form required by a electrical power operating company or by an insurance carrier. In some embodiments, the form may be customized using a design tool installed on a laptop and the form may then be uploaded to the test set. In another embodiment, the design tool may be installed on the test set, and the form may be customized directly on the test set while the test set is in a design mode of operation.

Figure 1:
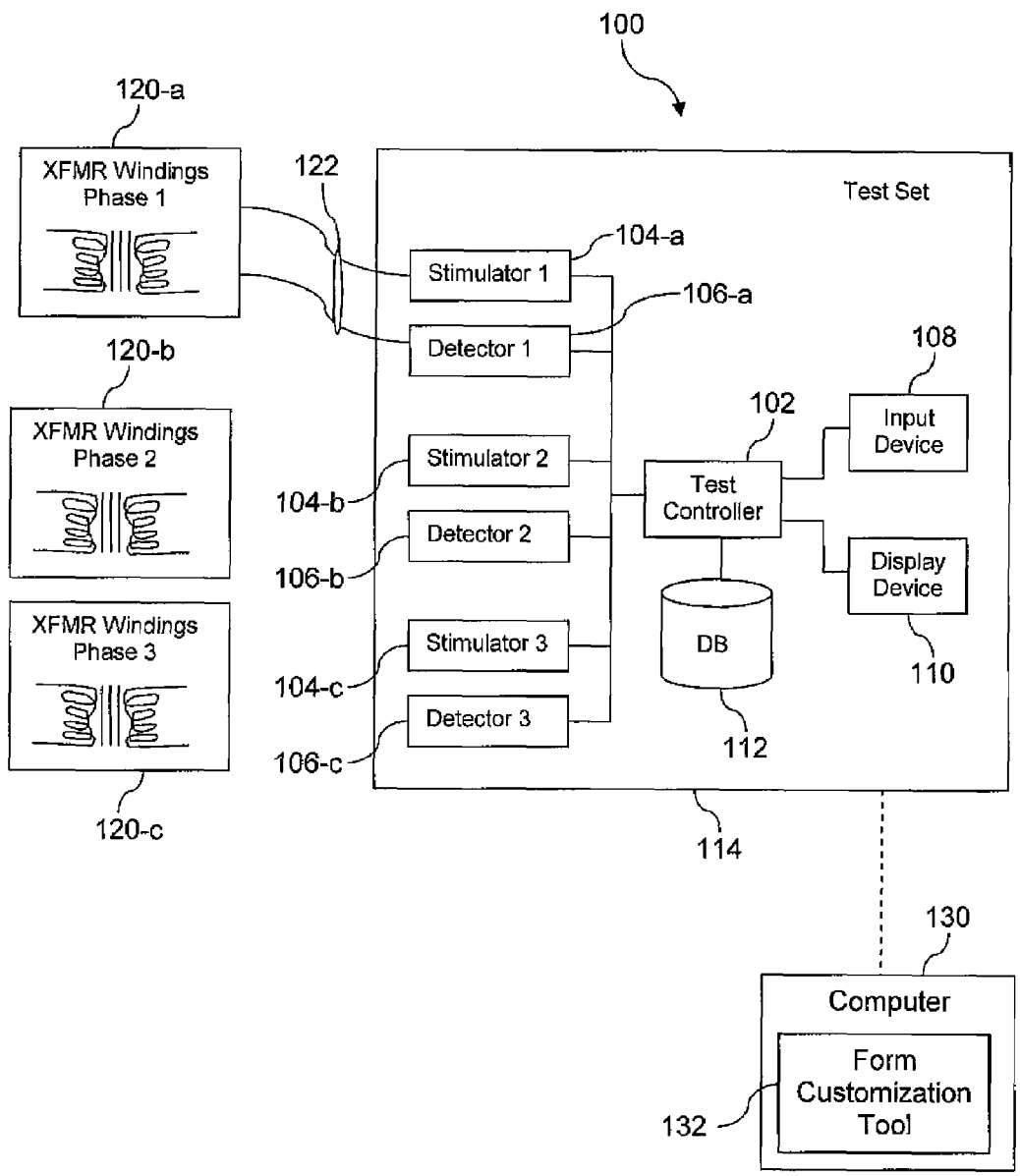
FIG. 1 illustrates a test set according to an embodiment of the disclosure.

Turning now to FIG. 1, a power system component test set 100 is described. The test set 100 comprises three stimulator circuits 104—a first stimulator circuit 104-a, a second stimulator circuit 104-b, and a third stimulator circuit 104-c. The test set 100 comprises three detector circuits 106—a first detector circuit 106-a, a second detector circuit 106-b, and a third detector circuit 106-c. In some embodiments, the stimulator circuits 104 may be integrated with the detector circuits 106. In some embodiments, the number of stimulator circuits 104 may be different from the number of detector circuits

106. For example, in an embodiment the test set 100 may comprise three stimulator circuits 104 and only one detector circuit 106. Alternatively, in another embodiment the test set 100 may comprise only one stimulator circuit 104 and three detector circuits 106. The test set 100 also comprises a test controller 102, an input device 108, a display device 110, and a test results database 112. The test set 100 is enclosed within a case 114 that includes electrical shielding.

The test set 100 may be connected to a first transformer winding 120-*a* using a harness 122. A variety of harness configurations are possible, all of which are contemplated by the present disclosure. Three separate harnesses 122 may be employed to connect the first stimulator circuit 104-*a* and the first detector circuit 106-*a* to the first transformer winding 120-*a*, to connect the second stimulator circuit 104-*b* and the second detector circuit 106-*b* to a second transformer winding 120-*b*, and to connect the third stimulator circuit 104-*c* and the third detector circuit 106-*c* to a third transformer winding 120-*c*.

Alternatively, the three transformer windings may be tested independently, one winding after the other. For example, the harness 122 may be connected to the first transformer winding 120-*a*, to the first stimulator circuit 104-*a*, and to the first detector circuit 106-*a*, and the first transformer winding 120-*a* may then be tested. Thereafter the harness 122 may be disconnected from the first transformer winding 120-*a*, from the first stimulator circuit 104-*a*, and from the first detector circuit 106-*a*, connected to the second transformer winding, to the second stimulator circuit 104-*b*, and to the second exciter 106-*b*, and the second transformer winding 120-*b* may then be tested. Thereafter the harness 122 may be disconnected from the second transformer winding 120-*b*, from the second exciter 104-*b*, from the second detector circuit 106-*b*, and connected to the third transformer winding 120-*c*, to the third exciter 104-*c*, and to the third detector circuit 106-*c*, and the third transformer winding 120-*c* may then be tested.

In another embodiment, a single harness may provide all connections and cabling necessary to connect all three stimulator circuits 104 and all three detector circuits 106 to three transformer windings 120. While three separate transformer windings 120 are depicted in FIG. 1, the test set 100 is operable to test transformers having other numbers of transformer windings 120 and other configurations of transformer windings 120. A wide variety of power system transformer configurations are known, and the test set 100 is operable to test many or all of these power system transformer configurations.

Each stimulator circuit 104 stimulates or excites the power system component under test. For example, the first stimulator circuit 104-*a* may generate a direct current (DC) voltage stimulation signal to stimulate the first transformer winding 120-*a*. In an embodiment, the stimulator circuit 104 may be capable of outputting a current stimulation signal of up to about 500 mA. In an embodiment, the stimulator circuit 104 may be capable of outputting test voltages of about 80 Vrms, about 40 Vrms, and about 8 Vrms, when the current output is within operational limits. In another example, the first stimulator circuit 104-*a* may generate an alternating current (AC) voltage signal that sweeps across a range of frequencies to stimulate the first transformer winding 120-*a*. Many other stimulation signals may be generated by the stimulator circuits 104, all of which are contemplated by the present disclosure. The stimulation signals may also be referred to as test signals.

Each detector circuit 106 detects, records, or measures the response of the transformer winding 120 to the stimulation signal output by the stimulator 104. For example, the first detector circuit 106-*a* detects the response of the first transformer winding 120-*a* to the stimulation signal output by the first stimulator circuit 104-*a*. The detector circuit 106 may include one or more analog-to-digital converters to periodically capture the voltage and/or current of an output of the transformer winding and other circuitry to store the digital values in a memory. In an embodiment, the detector circuit 106 may include other circuitry or processing functionality to analyze the captured response to determine a test result parameter, for example a resistance of the transformer winding 120, an impedance of the transformer winding 120, a frequency response of the transformer winding 120, a turns ratio of the transformer winding 120, a power factor of the transformer winding 120, and others. Alternatively, in another embodiment, the detector circuit 106 provides unprocessed data to the test controller 102, and the test controller 102 analyzes the unprocessed data to determine the test result parameter.

The test controller 102 conducts the test of the power system transformer by controlling the stimulator circuits 104 and the detector circuits 106. The test controller 102 receives inputs from the input device 108 to define test values and/or parameter values that are used to command the stimulator circuits 104. In an embodiment, the inputs may be in the form of alphanumeric text entered into fields of a test form that is displayed on the display device 110. The test controller 102 determines test control parameters to send to the stimulator circuits 104 based on the input obtained from the fields of the test form. The test controller 102 also receives inputs from the input device 108 to command test state transitions, for example a start command, a stop command, a repeat command, and other such commands. The test controller accesses the test results database 112 to store results of testing and to read test results from earlier tests.

In an embodiment, the test form may be customizable, for example by using a computer 130 loaded with a form customization tool 132 and downloading the customized test form to the test set 100. Alternatively, the form customization tool 132 may be loaded on the test set 100 and executed by the test controller 102 while in a design mode of the test set 100. The form customization tool 132 promotes field personnel and/or electric power utility employees revising the test forms to add or remove control and/or result parameters, fields, cells, and other information that is presented in the test form when it is presented on the display device 110. Customarily, interface applications may be coded in high level computer programming languages, compiled, assembled, and installed for execution by a processor, such as the controller 102. This may require the involvement of highly skilled computer programmers at the test set manufacturers design and/or manufacturing location. This may entail both substantial costs and time delays in deploying a requested customization. The form customization tool 132 is a user friendly tool that permits field personnel and/or electric power utility employees to customize the test forms without being skilled computer programmers. For example, the form customization tool 132 may provide a graphical interface that promotes dragging and dropping interface elements and/or components onto the test form and dragging components around to position as desired in the test form.

The input device 108 may be a keyboard and/or keypad and/or touchscreen. The input device 108 may also comprise one or more switches and/or pushbuttons. The display device 110 may be a flat panel display, a liquid crystal display (LCD), or other display. In an embodiment, the input device 108 comprises a QWERTY keyboard, including roman numeral keys 1 through 9 and 0, a test button, a five button navigation pad, a home key, a zone key, a power suspend key, a help function key, an information key, and a function key. The QWERTY keyboard is used for entry of alphanumeric and other input, for example data and notes. The test button is used to initiate and terminate testing. The five button navigation pad is used to move a display cursor left/right and up/down and to activate a selection, for example to navigate through cells or fields of a test form. The zone key selects an active region of the display device 110. The help function key selects on-screen Help to assist an operator of the test set 100. The information key selects on-screen information to assist an operator of the test set 100. The function key displays the options available for any selection highlighted on the display device 110. In other embodiments, however other input functions and other input keys, switches, or devices may be used by the test set 100.

The case 114 is a ruggedized plastic case that is designed to absorb and dampen mechanical disturbances, for example bumps or jars from metal tools or falls onto concrete. The case 114 includes electrical shielding to protect the components of the test set 100 from the strong electromagnetic fields and/or electric fields that may be experienced at electrical power system locations, for example at electrical power generating stations and/or electrical power distribution stations. The case 114 is designed to contain the harness 122 when closed.

The test set 100 may be coupled to local AC power, for example 120 VAC power or 220 VAC power. The test set 100 may be coupled to a printer at the test location, in the field, to print out test results on location, while the test set 100 remains coupled to the power system component under test. This may have multiple benefits, including providing the operator of the test set 100 with an opportunity to carefully review the test results to assure that the test has completed and all essential test result parameters have been determined. If some test result parameters remain undetermined, the operator may resume and complete the test. This may save time, money, and damaged business relationships versus needing to schedule a follow-up test. Additionally, the electrical power operating company and/or electrical power utility company may prefer to have the record of the test entered into their notebooks or logs immediately.

It will be appreciated by one skilled in the art that the power system component test set 100 may readily be employed for testing power system components other than power system transformers, including generators, motors, batteries, protection relays, circuit breakers, and others, in some cases after making appropriate modifications to stimulator circuits 104 or detector circuits 106 or test controller 102.

Figure 2:
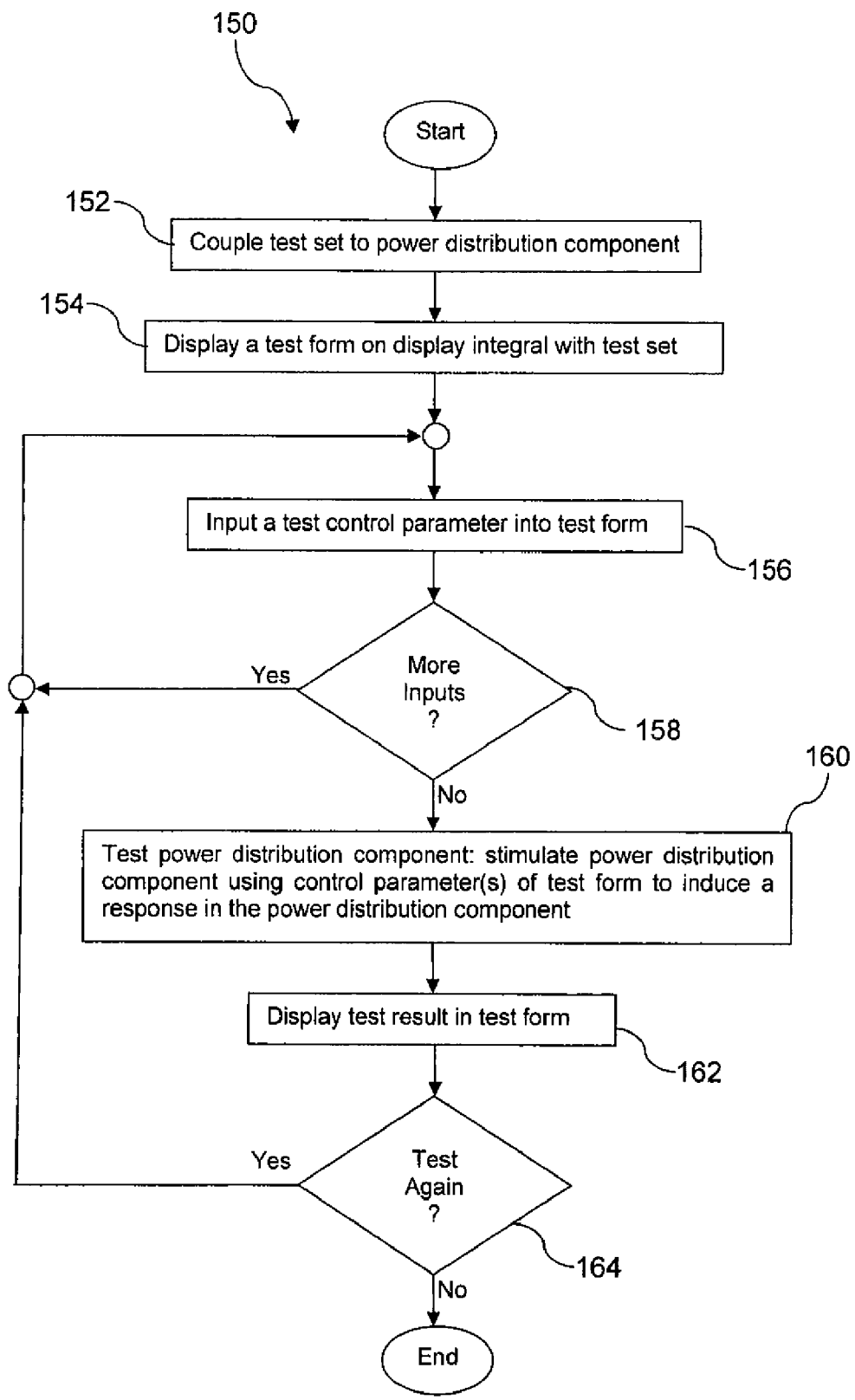
FIG. 2 is a flow diagram of a method of testing a power system component according to an embodiment of the disclosure.

Turning now to FIG. 2 a method 150 of testing a power system component is discussed. In block 152, the test set 100 is coupled to the power system equipment. This step may involve connecting the harness 122 to stimulator circuits 104 and detector circuits 106 and to the power system equipment, for example to transformer windings 120 or to protection relay solenoid energizing coils or to battery terminals. This action may also comprise connecting the test set 100 to ground that is common with the power system equipment ground.

In block 154, a test form is displayed on the display device 110 integral with the test set 100. In an embodiment, the test form may be displayed in a graphical interface that is presented on the display device 110. The test form may be a grid of cells and/or fields having column titles and row titles. Some test form cells may contain test control parameters and other test form cells may contain test result parameters. The test form may be customized or configured using a software tool either on the test set 100 or on a laptop or other computer, for example the form customization tool 132. The software tool may promote changing the input and output parameters that may be provided in the form. The software tool may promote changing the arrangement of parameters, cells, and other information presented in the form. If the test form is customized on a laptop or other computer, the customized test form may thereafter be downloaded to the test set 100.

In block 156, a test control parameter is entered into the test form, for example an excitation voltage may be entered into the test form. Additionally, a variety of identity information may be entered into the test form, for example a name of the test form, a date of test, a name of a power distribution operating company, a serial number of the power system component, and other such information. In block 158, if more test control parameters remain to be entered, the process returns to block 156.

In block 160, the power system component is tested automatically, or with limited operator intervention, by the test set 100. The test set 100 stimulates the power system component based at least in part on the test control parameters entered in block 156. The test set 100 then senses or detects the response of the power system component to the stimulation signal. The test set 100 analyzes the response of the power system component to determine one or more test result parameters. For example, test set 100 may stimulate the power system component with a DC voltage and detect a DC current that flows through the power system component. Based on the known stimulation DC voltage and the detected DC current, the test set 100 may determine a resistance test result parameter of the power system component.

In block 162 the test results are displayed by the display device 110 that is integral with the test set 100. In an embodiment, the test result parameters are updated in the appropriate cells or fields of the test form on the display device 110 in real-time as the test set 100 determines the one or more test result parameters. For purposes of the present disclosure, real-time means that test result parameter data is displayed with a delay which is acceptable to a test operator monitoring the display device 110. For example, a test result parameter may be displayed in the test form on the display device 110 within 5 seconds of the value of the test result parameter being determined by the test set 100. In some cases, the test result parameter may be displayed in the test form in less time, for example within 1 second of the value of the test result parameter being determined by the test set 100. In an embodiment, the test form is printed out by a printer (not shown) coupled to the test set 100 at the field location, while the test set 100 remains coupled to the power system component under test. In an embodiment, the printed test results are substantially the same as the test form displayed by the display device 110, a "what-you-see-is-what-you-get" printout. In some cases, an operator may erroneously deem testing complete when some test result parameters of the power system component remain to be determined and the test is incomplete. Printing the test form out at the field location may provide a check on the completeness of testing and provide an opportunity for the operator to discover their error and to complete the test before packing up the test set 100 and returning to the laboratory. If the test result is only printed out back at a laboratory, the incompleteness of the test may be discovered too late and a second trip to the field to repeat the test of the power system component may be required. Because the power system component may need to be taken off the electrical power grid and powered down, this kind of mistake may be costly and may damage the business relationship between a third party testing company and their client, the power distribution operating company. In block 164, if it is desired to test again, the method 150 returns to block 156, otherwise the method 150 exits.

Figure 3:
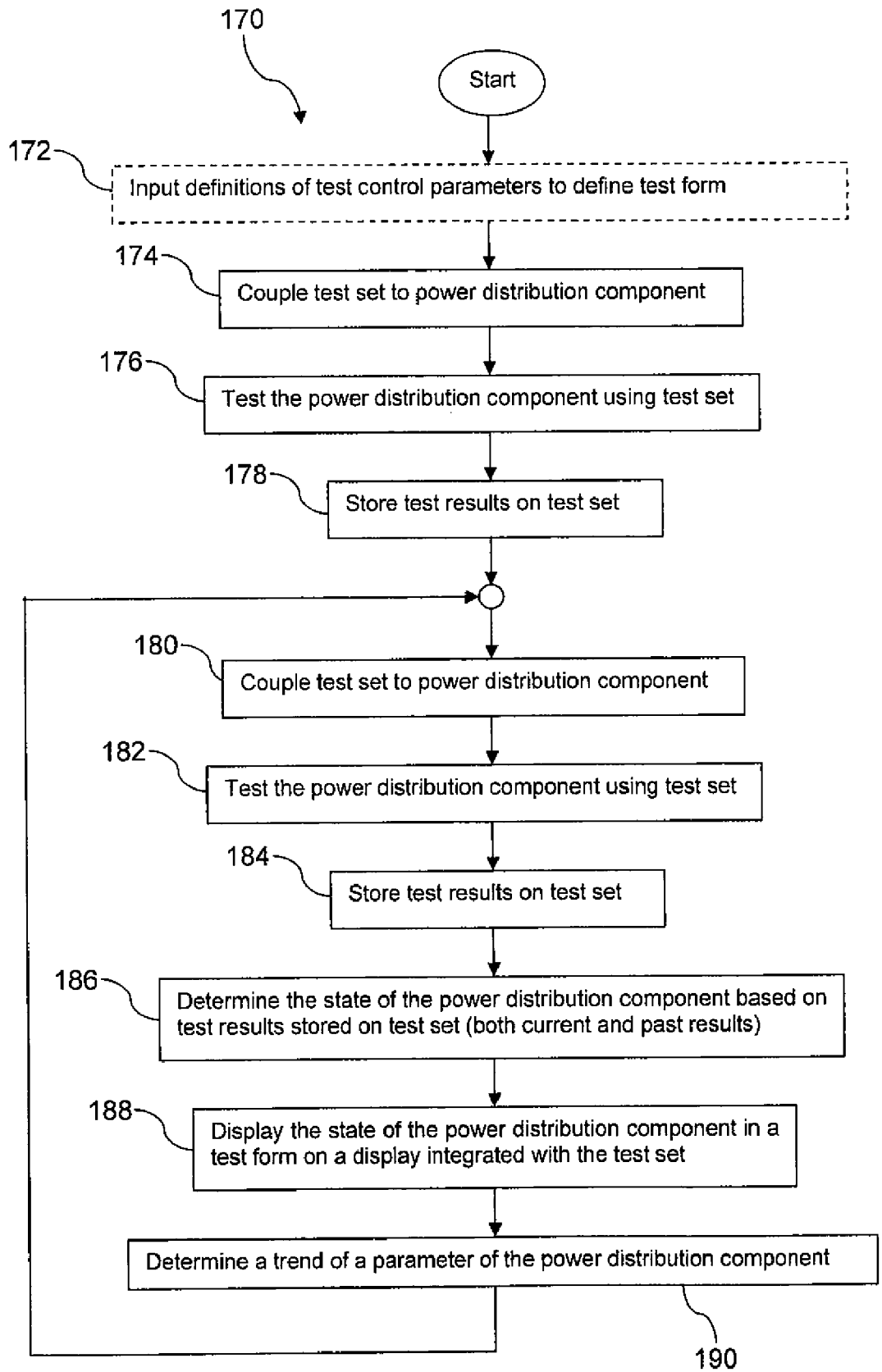
FIG. 3 is another flow diagram of a method of testing a power system component according to an embodiment of the disclosure.

Turning now to FIG. 3, a method 170 of testing a power system component is described. In block 172, optionally definitions of a test form are input. These definitions may define one or more test control parameters as well as define the presentation of the both the test control parameters and the test result parameters form data. This optional block may promote a third party testing service providing support for different test procedures and different presentation of test results for different power distribution operating company clients. Alternatively, this optional block may promote providing support for different test procedures and/or presentation of test results for different insurance carriers.

In block 174, the test set 100 is coupled to the power system equipment. This step may involve connecting the harness 122 to stimulator circuits 104 and detector circuits 106 and to the power system equipment, for example to transformer windings 120 or to protection relay solenoid energizing coils or to battery terminals. This action may also comprise connecting the test set 100 to ground that is common with the power system equipment ground.

In block 176, the power system component is tested automatically based on test control parameters, or with limited operator intervention, by the test set 100 and test result parameters are determined. In block 178, the test result parameters are stored on the test set 100, for example in the test results database 112. The test result parameters may be stored along with meta data about the testing, for example a time and date stamp of when the test was completed, a serial number of the power system component tested, an ambient temperature during the test, a name of the power distribution operating company, a name of the operator conducting the test, and other information. The test control parameters may also be stored with the test result parameters.

In block 180, the test set 100 is again coupled to the power system component, for example after the passage of several months since the previous test of blocks 174, 176, 178, on the occasion of the next periodic scheduled testing of the power system component. In block 182, the power system component is tested again, similarly to block 176. In block 184, the test result parameters are stored again, similarly to block 178.

In block 186, the state or condition of the power system component is determined by the test set 100 based at least in part on the current test result parameters, for example those stored in block 184, and test result parameters stored during one or more earlier test operations. In an embodiment, the test set 100 may use the most recent six months or the most recent year or some other limited time interval of stored test result parameters associated with the power system component. In another embodiment, all stored test result parameters are used. In block 188, the state of the power system component is displayed in the test form on the display device 110 integral with the test set 100.

In block 190, a trend of a parameter of the power system component is determined by the test set 100. For example, the test set 100 may determine that over the six years of operation of a power system component winding resistance has increased 20 percent. In an embodiment, the test set 100 may project or trend or forecast that the power system component winding resistance may exceed operational limits in two years, based on the stored test results available to the test set 100, for example in the test results database 112. In an embodiment, a trend of each of a plurality of parameters of the power system component may be determined by the test set 100 and projected based on the stored test results. The projection of when one or more parameters of the power system component may go out of operational tolerance may help a power distribution operating company to effectively budget plant upgrades and equipment replacement. In an embodiment, the test set 100 may project an operating cost variance based on the deviation of one or more parameters of the power system component from preferred values, for example power loses in transformer windings due to increased winding resistance related to gradual degradation of winding wires. After block 190, the method 170 is shown to repeat indefinitely by returning to block 180.

Figure 4:
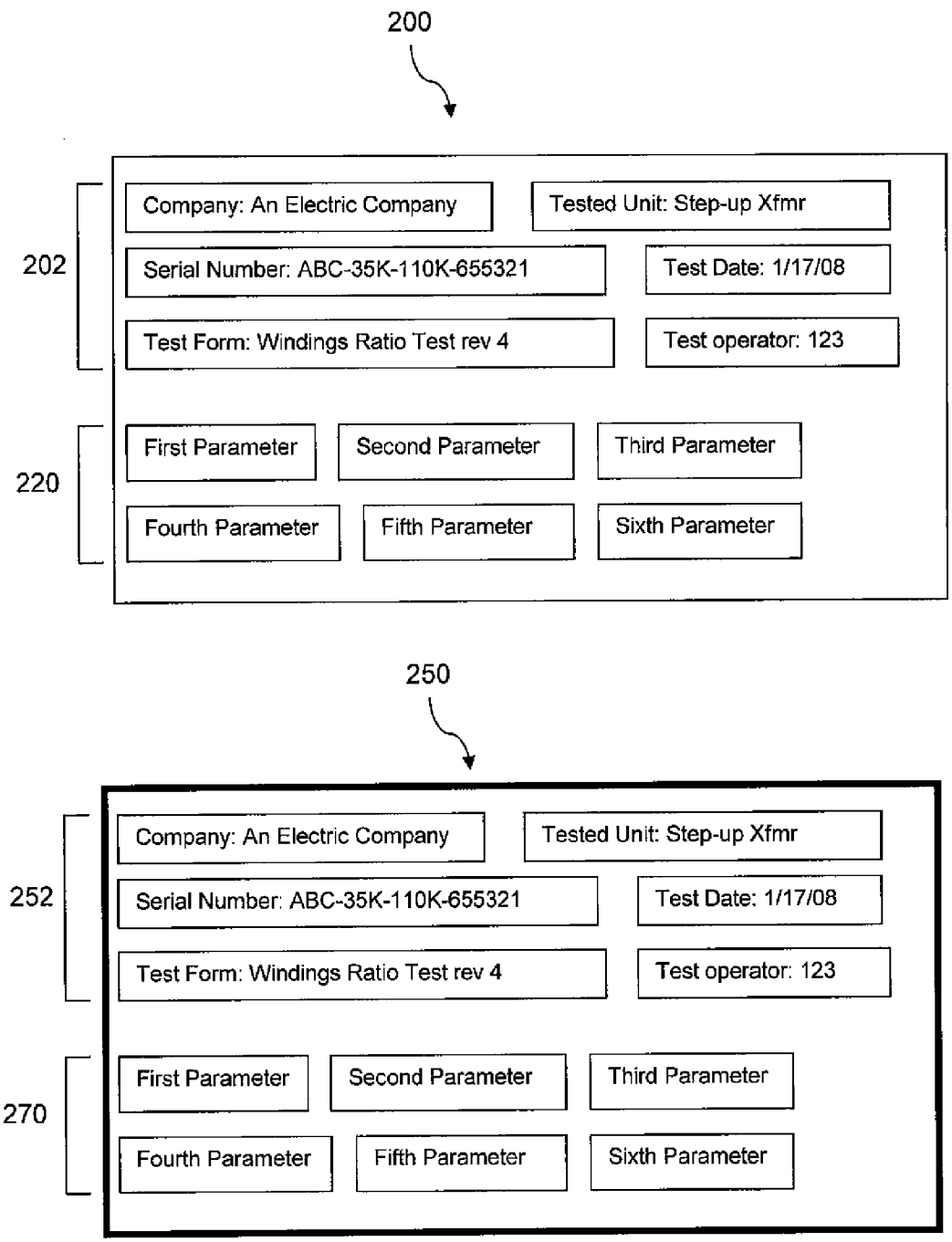
FIG. 4 is illustrates an exemplary graphical user interface and a report associated with a form displayed on the graphical user interface.

Turning now to FIG. 4, an exemplary graphical user interface (GUI) 200 containing a form and a report 250 associated with the form are discussed. The form displayed in the GUI may contain contextual information 202 related to a test operation, for example a name of the company that owns the equipment under test, a name or type of equipment under test, a serial number of the equipment under test, a test date, a name or other identification of the test form used to conduct the test, and the name or identification number of the operator conducting the test. The form may also contain a plurality of parameters 220. Some of the parameters may be input parameters or control parameters. The control parameters provide information that may be used to adjust or control the test, for example defining for the test controller 102 how to command the stimulator circuits 104. Some of the parameters may be output parameters or results parameters. The results parameters may provide the measured values of the response of the equipment under test to the stimulation signals applied. The results parameters may be determined by the test controller 102 by analyzing a plurality of measured values, for example to determine a transformer winding turns ratio.

The report 250 represents an output of the test set 100, for example a printed report. The report 250 is substantially a duplicate of the contents of the GUI 200. The report 250 may be scaled in dimensions to be printed on standard sized papers, but contains the same information displayed in the GUI 200. For example, the report 250 contains contextual information 252 that corresponds substantially to the contextual information 202 shown in the GUI 200. The report 250 also contains a plurality of parameters 270 that correspond substantially to the parameters 220.

In some embodiments, other contextual information 202, 252 may be provided by the GUI 200 and the report 250. In some embodiments, other parameters 220, 270 may be provided by the GUI 200 and the report 250. In an embodiment, the GUI 200 and the report 250 may provide trend information related to one or more of the parameters 220, 270. The trend information may indicate a rate of change of the parameters or may be represented as a graph of the parameter or parameters versus time, showing the trend as a trend-line on the graph.

The report 250 may be printed out at the field location where the testing operation is performed, for example using a portable printer coupled to the test set 100. If portions of a test or key parameter values are missing, printing the report 250 while still at the field location may promote discovery of the incompleteness of the test while still on location when the test may be easily repeated and completed.

The form displayed in the GUI 200 is readily modified using the test set 100. For example, different contextual information 202, 252 may be preferred by different electric companies. Different test procedures may be preferred by different electric companies. The form displayed in the GUI 200 may be modified accordingly.

Figure 5:
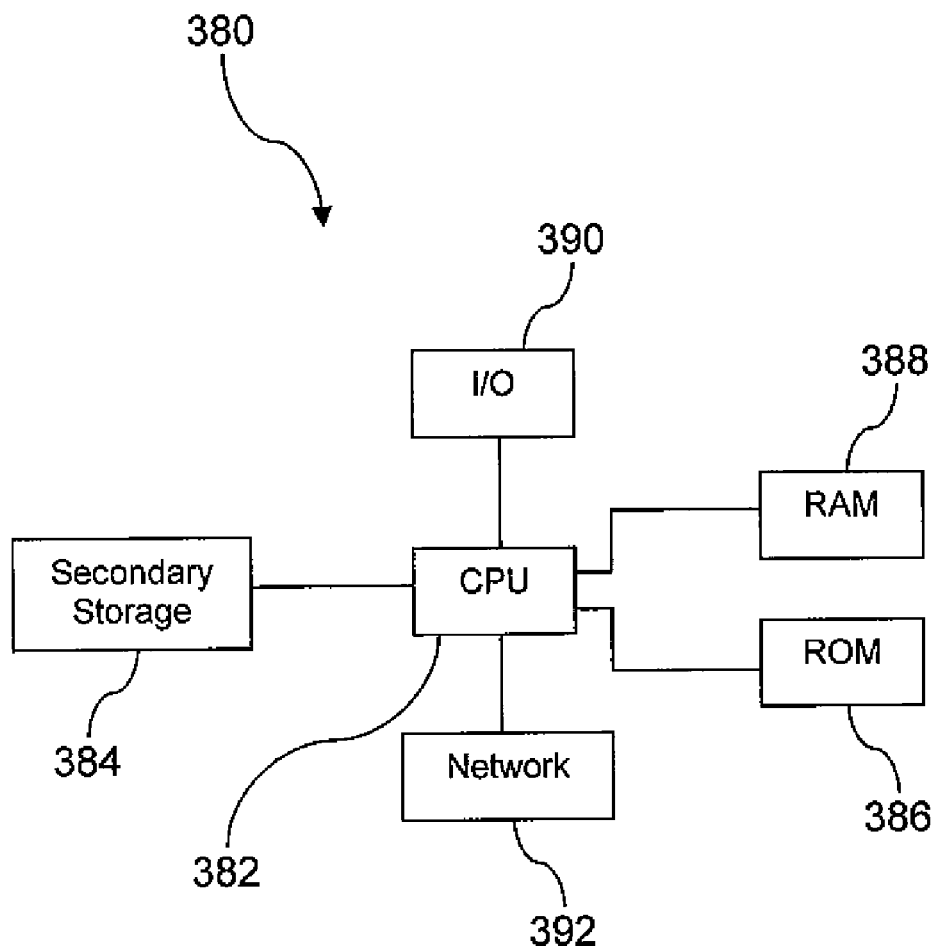
FIG. 5 illustrates an exemplary general purpose computer system suitable for implementing at least portions of the several embodiments of the disclosure.

FIG. 5 illustrates a typical, general-purpose computer system 380. Portions of the power system component test set 100 described above may be implemented using the general-purpose computer 380 with sufficient processing power, memory resources, and network throughput capability to handle the necessary workload placed upon it and with appropriate mechanical and electrical shielding to protect the general-purpose computer from the harsh environment of the power system field environment. The computer system 380 includes a processor 382 (which may be referred to as a central processor unit or CPU) that is in communication with memory devices including secondary storage 384, read only memory (ROM) 386, random access memory (RAM) 388, input/output (I/O) devices 390, and network connectivity devices 392. The processor may be implemented as one or more CPU chips.

The secondary storage 384 is typically comprised of one or more disk drives or tape drives and is used for non-volatile storage of data and as an over-flow data storage device if RAM 388 is not large enough to hold all working data. Secondary storage 384 may be used to store programs which are loaded into RAM 388 when such programs are selected for execution. The ROM 386 is used to store instructions and perhaps data which are read during program execution. ROM 386 is a non-volatile memory device which typically has a small memory capacity relative to the larger memory capacity of secondary storage. The RAM 388 is used to store volatile data and perhaps to store instructions. Access to both ROM 386 and RAM 388 is typically faster than to secondary storage 384.

I/O devices 390 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 392 may take the form of modems, modem banks, ethernet cards, universal serial bus (USB) interface cards, serial interfaces, token ring cards, fiber distributed data interface (FDDI) cards, wireless local area network (WLAN) cards, radio transceiver cards such as code division multiple access (CDMA) and/or global system for mobile communications (GSM) radio transceiver cards, and other well-known network devices. These network connectivity devices 392 may enable the processor 382 to communicate with an Internet or one or more intranets. With such a network connection, it is contemplated that the processor 382 might receive information from the network, or might output information to the network in the course of performing the above-described method steps. Such information, which is often represented as a sequence of instructions to be executed using processor 382, may be received from and outputted to the network, for example, in the form of a computer data signal embodied in a carrier wave Such information, which may include data or instructions to be executed using processor 382 for example, may be received from and outputted to the network, for example, in the form of a computer data baseband signal or signal embodied in a carrier wave. The baseband signal or signal embodied in the carrier wave generated by the network connectivity devices 392 may propagate in or on the surface of electrical conductors, in coaxial cables, in waveguides, in optical media, for example optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, referred to herein as the transmission medium, may be generated according to several methods well known to one skilled in the art.

The processor 382 executes instructions, codes, computer programs, scripts which it accesses from hard disk, floppy disk, optical disk (these various disk based systems may all be considered secondary storage 384), ROM 386, RAM 388, or the network connectivity devices 392. While only one processor 392 is shown, multiple processors may be present. Thus, while instructions may be discussed as executed by a processor, the instructions may be executed simultaneously, serially, or otherwise executed by one or multiple processors.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A method of testing a power system component, comprising:
    coupling a test set to the power system component;
    displaying a test form on a display integral with the test set;
    inputting at least a first test control parameter into the test form using an interface integral with the test set;
    stimulating the power system component using the test set to produce a first response of the power system component, wherein the stimulating is performed based at least in part on the first test control parameter;
    displaying a first test result in the test form on the display, wherein the first test result is based on the first response; and
    determining a trend of at least one parameter of the power system component, including projecting a date when the parameter will exceed an operational limit.

2. The method of claim 1, wherein the first test control parameter is input into the test form using one of a keyboard integral with the test set, a keypad with the test set, and a touch screen integral with the test set.

3. The method of claim 1, further including storing the first response on the test set.

4. The method of claim 1, wherein the power system component includes one of a power system transformer, a power distribution relay, and a battery.

5. The method of claim 1, wherein the first test result comprises a plurality of result parameter values, and wherein each of the result parameter values display in real-time in the test form as the parameter value is determined.

6. The method of claim 1, further including printing a first test report of the first test result on a printer coupled to the test set while the test set is coupled to the power system component.

7. The method of claim 1, further including:
inputting at least a second test control parameter into the test form using the interface integral with the test set;
stimulating the power system component using the test set to produce a second response of the power system component, wherein the stimulating is performed based at least in part on the second test control parameter; and
displaying the second test result in the test form in the display, wherein the second test result is based on the second response, wherein the test set remains continuously coupled to the power system component from before stimulating the power system component based on the first test control parameter to after displaying the second test result.

8. The method of claim 1, wherein the test set is contained inside a single case.

9. The method of claim 8, wherein the case is a ruggedized plastic case surrounding the outside of the test set, adapted to absorb and dampen mechanical disturbances.

10. A method of testing a power system component, comprising:
coupling a test set to the power system component;
displaying a test form on a display integral with the test set;
inputting at least a first test control parameter into the test form using an interface integral with the test set;
stimulating the power system component using the test set to produce a first response of the power system component, wherein the stimulating is performed based at least in part on the first test control parameter;
displaying a first test result in the test form on the display, wherein the first test result is based on the first response; and determining a trend of at least one parameter of the power system component, including projecting an operating cost variance based on a deviation of the at least one parameter of the power system component from at least one preferred value.

11. A method of testing a power system component, comprising:
coupling a test set to the power system component by connecting three separate harnesses to the power system component;
displaying a test form on a display integral with the test set;
inputting at least a first test control parameter into the test form using an interface integral with the test set;
stimulating the power system component using the test set to produce a first response of the power system component, wherein the stimulating is performed based at least in part on the first test control parameter;
displaying a first test result in the test form on the display, wherein the first test result is based on the first response; and
determining a trend of at least one parameter of the power system component.

12. A method of testing a power system component, comprising:
coupling a first harness of a test set to connect a first stimulator circuit and a first detector circuit to a first power system component winding;
coupling a second harness of a test set to connect a second stimulator circuit and a second detector circuit to a second power system component winding;
coupling a third harness of a test set to connect a third stimulator circuit and a third detector circuit to a third power system component winding;
displaying a test form on a display integral with the test set;
inputting at least a first test control parameter into the test form using an interface integral with the test set;
stimulating at least the first power system component winding using the test set to produce at least a first response of the first power system component winding, wherein the stimulating is performed based at least in part on the first test control parameter; and
displaying a first test result in the test form on the display, wherein the first test result is based on the first response.

13. The method of claim 12, further including:
inputting at least a second test control parameter into the test form using an interface integral with the test set;
stimulating at least the second power system component winding using the test set to produce at least a second response of the second power system component winding, wherein the stimulating is performed based at least in part on the second test control parameter; and
displaying a second test result in the test form on the display, wherein the second test result is based on the second response.

14. A method of testing a power system component, comprising:
coupling a portable test set contained in a single case to the power system component;
displaying a test form on a display integral with the test set;
inputting at least a first test control parameter into the test form using an interface integral with the test set;
stimulating the power system component using the test set to produce a first response of the power system component, wherein the stimulating is performed based at least in part on the first test control parameter;
displaying a first test result in the test form on the display, wherein the first test result is based on the first response; and
determining a trend of at least one parameter of the power system component, including projecting an operating cost variance based on a deviation of the at least one parameter of the power system component from at least one preferred value.

15. The method of claim 14, wherein the single case is a ruggedized plastic case adapted to absorb and dampen mechanical disturbances.

* * * * *